United States Patent [19]
Denker et al.

[11] Patent Number: 4,760,437
[45] Date of Patent: Jul. 26, 1988

[54] NEURAL NETWORKS

[75] Inventors: John S. Denker, Red Bank; Richard E. Howard; Lawrence D. Jackel, both of Holmdel, all of N.J.

[73] Assignee: American Telephone and Telegraph Company, AT&T Bell Laboratories, Murray Hill, N.J.

[21] Appl. No.: 796,085

[22] Filed: Jan. 3, 1986

[51] Int. Cl.$^4$ .......................................... H01L 27/14
[52] U.S. Cl. .......................................... 357/30; 357/2
[58] Field of Search ............... 357/30 H, 30 Q, 30 K, 357/2

[56] References Cited

U.S. PATENT DOCUMENTS

| | | | |
|---|---|---|---|
| 4,360,821 | 10/1982 | Tsukoda | 357/30 K |
| 4,363,963 | 12/1982 | Ando | 357/30 Q |
| 4,589,003 | 5/1986 | Yamada | 357/2 X |

*Primary Examiner*—Martin H. Edlow
*Attorney, Agent, or Firm*—Bruce S. Schneider

[57] ABSTRACT

Neural network type information processing devices have been proposed. In these devices, a matrix structure is utilized with impedance at the matrix intersection points. It has been found that excellent versatility in design is achieved by utilizing photoconductors at these intersection points and thus affording the possibility of controlling impedance by, in turn, controlling the level of incident light.

14 Claims, 1 Drawing Sheet

U.S. Patent Jul. 26, 1988 4,760,437
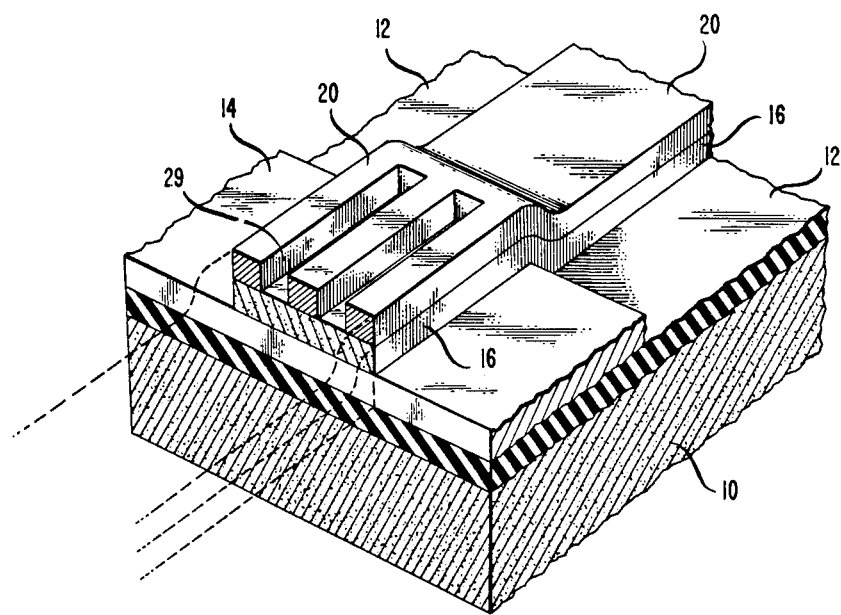

NEURAL NETWORKS

BACKGROUND OF THE INVENTION

1. Field of the Invention

This invention relates to devices suitable for processing information and, in particular, devices involving electronic processing.

2. Art Background

Recently, the neural network design of devices suitable for information processing has been proposed. (See *Proceedings of the National Academy of Science, USA*, Vol. 79, J. J. Hopfield, page 2554 (1982), and *Proceedings of the National Academy of Science, USA*, Vol. 81, J. J. Hopfield, page 3088 (1984), for a general description of this design.) Basically, such a network includes (1) a matrix having an impedance element at each intersection (infinite and zero impedances are not precluded) with at least one interconnect (i.e., an intersection region allowing the passage of at least $1 \times 10^{-12}$ amp) in each active row and at least one interconnect in each active column and (2) active element(s) (e.g., amplifying devices that have gain greater than one) interacting with the matrix. The network is tailored to perform a desired processing function by appropriately choosing the impedance magnitude for each matrix intersection.

A variety of methods have been contemplated for fabricating the matrix. For example, it has been proposed that an impedance material be placed between an upper layer of conductive strips representing the columns of the matrix and a perpendicularly positioned lower layer of strips representing the rows. (The use of the terms "columns" and "rows" is merely to differentiate the two sets of electrodes, and such denomination could be reversed.) Impedance is supplied, for example, through the resistance or capacitance of the material at the interconnection. The impedance at each intersection is fixed by suitably adjusting (1) the composition of the impedance material and/or (2) the thickness of the impedance material and/or (3) the geometry at each matrix intersection. (A matrix intersection is the region of material connecting a row with a column that is capable of having an impedance specified in accordance with the information processing to be accomplished.) By thus fixing the geometry, composition, and thickness of the impedance material at a matrix intersection, the total impedance of the intersection is determined.

A structure depending on appropriately tailoring intersection composition, thickness, or geometry, although useful, has several drawbacks. For example, the necessity for increasing intersection geometry to concomitantly alter impedance unacceptably augments, for many applications, the area of the entire structure. Even more significantly, the variation of impedance material composition, thickness, or geometry at each intersection, although possible, substantially complicates the fabrication procedure. Thus, although various device structures have been contemplated, increased manufacturing convenience is certainly desirable.

SUMMARY OF THE INVENTION

Through the use of a photoconductive material, the manufacturing process is significantly simplified, and the flexibilty of the resulting manufactured structure is substantially improved. In one embodiment, a lower electrode array defining the rows of the matrix is fabricated. A dielectric material such as a polyimide is then deposited in a region if no photoconductor will be present in that region and if no electrical conduction through the region is desired. A layer of photoconductive material is then deposited. Electrodes defining the columns of the matrix are formed generally over the photoconductive material in a pattern typically, but not necessarily, perpendicular to that of the underlying rows. (It is possible to form the rows and columns in the same plane with dielectric material between them at any overlap. Intersection regions are then formed by connecting a row to a column with a region of photoconductive material. It is also possible to employ a set of row electrodes and/or column electrodes that are not mutually parallel.)

The desired impedances are then easily established by controlling the level of light incident at each intersection. For example, a mask is placed over the structure which attenuates light at each intersection point relative to the level of impedance desired at that point. The mask is then illuminated, and the attenuation introduced by the mask determines the level of impedance at each intersection point. By this expedient, the impedances at intersection points are adjusted by merely changing the resulting mask. Thus, matrix configurations suitable for solving numerous problems are obtained simply by employing a suitable mask. Most significantly, it is possible to use a relatively uniform photoconductive layer and relatively uniform matrix intersection points for the entire matrix. As a result, versatility is obtained while fabrication expedience is not compromised.

BRIEF DESCRIPTION OF THE DRAWING

The FIGURE is illustrative of a portion of a matrix useful in the subject invention.

DETAILED DESCRIPTION

The structures of the invention are advantageously produced on a substrate that provides mechanical support. By utilizing a substrate, 10 in the FIGURE, such as a surface oxidized silicon substrate, it is possible to produce a monolithic structure by fabricating the matrix on the silicon oxide and the active elements in the silicon. However, the use of a separate structure for matrix and interactive elements is not precluded. Generally, the interactive devices are advantageously produced before the matrix is fabricated because the high temperatures often required for fabricating active devices tend to degrade the matrix material. If this fabrication sequence is employed, the steps utilized in forming the matrix should be chosen to avoid unacceptable degradation of the previously produced devices. For example, generally temperatures should be limited to 500 degrees C.

Since relatively high current densities are expected during matrix operation, it is generally desirable to use metal electrodes that resist electromigration and are relatively heat insensitive. Typically, metals such as tungsten, molybdenum, niobium, nickel, and their alloys are suitable. Generally, each row or column electrode, 14 and 20, respectively, should have a width in the range 500 $\mu$m to 0.5 $\mu$m. Widths greater than 500 $\mu$m lead to unnecessarily large matrices, while widths less than 0.5 $\mu$m yield undesirable diffraction effects. Since it is advantageous to control the intersection impedance with light, any other material in the light path should be sufficiently transparent to allow incident light to reach the photoconductive materials at a sufficient intensity to produce the desired range of impedances. For example, windows, 29, are fabricated in the column electrodes, and illumination is accomplished through these windows. For many exemplary processing procedures, at least 50 columns and 50 row electrodes are employed.

The impedance produced at a given light intensity level varies widely with the wavelength of the incident light, with the mobility of carriers in the intersection region, with the carrier lifetime in the intersection region, and with the contact behavior between the electrodes and the photoconductor. A control sample is easily utilized to determine an appropriate intensity for a desired impedance in a given matrix structure. However, generally intensities in the range 10 nw/intersection to 10 $\mu$watts/intersection are conveniently employed to produce useful impedances.

The sheet resistance of the row and column electrodes should also advantageously be less than 1000 ohms/□. Higher sheet resistance requires concomitantly increasing the intersection impedance so that it, rather than the impedance of the electrode, determines current flows. Typically, to maintain suitable sheet resistances, thickness greater than 0.01 $\mu$m and linewidths in the range 500 $\mu$m to 0.5 $\mu$m are advantageously employed. Regions thicker than 10 $\mu$m, although not precluded, present lithographic difficulties.

After the row electrodes are produced, a dielectric material is deposited. This dielectric material is deposited in a region where both (1) a photoconductor material is not present, and (2) current flow should be limited. The dielectric region should generally have an impedance such that at least 50 percent of the current in a row or column goes through the intersection as opposed to the dielectric material. For example, materials such as polyimides are utilized in the dielectric region in thicknesses ranging from 0.05 $\mu$m to 0.5 $\mu$m. (Thicker regions tend to produce unacceptable complications in lithographic fabrication.) For such materials, conventional photolithography and etching utilizing conventional materials such as AZ-4110 photoresist (a proprietary product of American Hoechst, Somerville, N.J.) and an oxygen plasma etchant are employed to produce the desired dielectric patterning.

The photoconductive material, 16, is deposited by conventional thin film deposition and patterning techniques to produce the desired intersection regions. For most applications, the illuminated impedance at intersection points is in the range 1 K ohm to 100 megaohms. Illuminated impedances less than 1 K ohm are typically not desirable because of resulting excess current and power dissipation. Impedances greater than 100 megaohms, although not precluded, generally do not yield significantly different results and possibly produce slower operations, increased noise, and greater parasitic conductance paths. For light levels producible by conventional techniques, in typical matrix structures, desired impedances are achieved by employing a photoconductor having, in the desired intersection geometry, a photoconductivity of at least $10^{-7}$ ohm$^{-1}$ watts$^{-1}$. However, photoconductor layer thicknesses less than 0.01 $\mu$m are difficult to form without undesirable pinholes and thicknesses greater than 10 $\mu$m present unacceptable fabrication difficulties.

Exemplary photoconductive materials are amorphous silicon, crystalline silicon, polycrystalline silicon, amorphous germanium, and cadmium sulfide. (See S. Sze, *Physics of Semiconductor Devices*, for a description of these various photoconductive materials and suitable methods for their deposition.) The column electrodes are then produced, for example, on the photoconductor and, if present, dielectric, in the same manner described for the production of the rows on the substrate.

Although the described fabrication procedure has been found to be convenient, a variety of other matrix fabrication techniques are possible and are not precluded. Irrespective of the fabrication technique and the ultimate structure produced, the presence of a photoconductive impedance element at a matrix intersection yields substantial design flexibility and affords the convenience of producing relatively spatially uniform structures with adjustable impedance. (The photoconductive material need not be at each intersection. However, in its absence, dielectric material is employed to prevent undesirable short circuits, or an alternate impedance material is utilized.)

As discussed, the impedance of the various elements is varied by utilizing a suitable light pattern. For example, light sources such as a xenon lamp, mercury arc lamp, and/or a laser are employable with a light valve corresponding to the desired resistance values at the matrix intersections, e.g., a suitably delineated metal layer mask or a suitable switched array of liquid crystal light valves. Alternatively, a patterned light source, e.g., a CRT display, is suitably imaged on the matrix. The impedance values are chosen, for example, to produce a content addressable memory or to solve optimization problems. Suitable impedance values for a wide variety of problems are described in U.S. patent application Ser. No. 693,479, filed Jan. 22, 1985, which is hereby incorporated by reference. For each desired set of impedance values corresponding to the solution of a desired problem, a suitable mask or patterned light source is employed. Although the structures of the invention are primarily intended to be adjusted by incident light, the structures are advantageously employed for solving problems without the presence of controlling light. Additionally, use of a photosensitive material to control input onto the matrix or gain of an active device is also advantageously employed.

The following example is illustrative of the invention.

EXAMPLE

A 0.32 $\mu$m thick layer of silicon dioxide, 12 in the FIGURE, was grown on the <100> plane of a silicon substrate, 10 (2 inches in diameter) using a standard thermal oxidation technique. (See S. Ghandhi, *Theory and Practice of Microelectronics*, Wiley & Sons, New York, pages 143-153 (1968) for a description of this technique.) After growth, the substrate was rinsed in deionized water and scrubbed to remove particles. The substrate was then sequentially boiled for 30 minutes in trichloroethane, boiled for 15 minutes in acetone, and rinsed in acetone for 15 minutes using ultrasound agitation. The substrate was then rinsed in methanol followed by deionized water. This rinse was followed by a 15-minute immersion in aqueous HF acid buffered with ammonium fluoride. (This buffer acid solution is a proprietary product of Transene Company, Inc., Rowley, Mass.) After the acid treatment, the substrate was rinsed in deionized water and blown dry with dry nitrogen.

The sample was placed in a vacuum evaporator. The evaporator was evacuated to a pressure of approximately $4 \times 10^{-7}$ Torr, and the substrate was then heated to approximately 265 degrees C. The oxide surface was cleaned by bombardment for 1 minute with a 12.5 milliamp argon ion current from a commercial argon ion gun having a beam energy of 300 volts and utilizing an argon pressure of approximately $8 \times 10^{-5}$ Torr. After cleaning, a tungsten source was heated by electron bombardment in a commerical electron beam evaporation source. The heating was controlled to yield a deposition rate of 5 Angstroms/second and was continued to produce a total thickness of 800 Angstroms. The apparatus was then backfilled with dry nitrogen, and the sample was removed.

The resulting tungsten layer was annealed by placing the sample on a graphite strip heater in vacuum station. The station was evacuated to a pressure of approximately $2 \times 10^{-6}$ Torr and backfilled to 100 Torr using flowing high-purity hydrogen. The flow was continued, and the pumping with a diffusion pump was adjusted to maintain this pressure level. The sample was annealed with the graphite strip heater for approximately 1 minute at 800 degrees C.

The sample was removed from the vacuum chamber, and a few drops of HPR-204 photoresist was placed on the tungsten-containing layer. (HPR-204 is a propriétary product of the Hunt Chemical Corporation, Pennsauken, N.J.) The sample was spun at 6000 rpm to produce a photoresist layer approximately 1 $\mu$m in thickness. The sample was baked in air at approximately 90 degrees C. for 30 minutes on a hot plate. The resist was then placed in a standard commercial mask aligner. This aligner employed a mercury arc lamp source yielding an exposure wavelength of 305 nm with a surface power density of 13 milliwatts/cm$^2$. The exposure was done for 30 seconds through a mask having a chromium pattern. The exposed resist was then developed for 25 seconds in 400K developer diluted to 1:3 by volume with deionized water. (400K developer is an alkaline aqueous solution that is a proprietary product of American Hoechst Corporation, Somerville, N.J.)

The tungsten exposed by the resist development was etched in a standard reactive ion etcher manufactured by Materials Research Corporation, Pearl River, N.Y. A plasma was struck in sulfur hexafluoride at a pressure of 10 milliTorr utilizing a self-biased voltage of 50 volts and a power density of 0.07 W/cm$^2$. The sulfur hexafluoride gas flow was maintained at a rate of 10 sccm, and the sample was placed during the etching on a quartz-covered cathode plate. After etching, the photoresist was removed by soaking the sample in acetone and then immersion in boiling gamma-butryolacetone for 30 minutes. The sample was then rinsed sequentially in acetone, methanol, and deionized water. The sample was then again placed onto the cathode of the reactive ion etching apparatus. An oxygen flow of 10 sccm was established. yielding a pressure of 10 milliTorr. To remove any remaining organic contaminant, the cathode was self-biased at 150 volts on a silicon base plate for 2 minutes. The tungsten deposition and subsequent delineation left a series of row electrodes, one of which, 14, is shown in the FIGURE.

The sample was then removed from the etcher and again placed on the sample holder of the electron beam evaporation apparatus. The apparatus was evacuated to a pressure of approximately $5 \times 10^{-7}$ Torr, and the sample surface was cleaned utilizing the previously described argon ion cleaning conductions. Silicon was then evaporated onto the tungsten-containing surface by sufficiently heating the electron beam source to yield a silicon deposition rate of approximately 3 Anstroms/second. During silicon deposition, a conventional ion gun was employed to simultaneously bombard the sample with hydrogen ions having a current of 12.5 milliamps and an energy of 400 electron volts. The simultaneous deposition of silicon and exposure to hydrogen was continued to achieve a deposited layer thickness of 1500 Angstroms.

The silicon deposition was then terminated, and molybdenum deposition was immediately initiated with sufficient heating to produce an evaporation rate between 8 and 10 Angstroms/second. During the molybdenum deposition, the sample was simultaneously bombarded with argon ions having a beam energy of 300 volts, a beam current of 12.5 milliamps utilizing an argon pressure of $8 \times 10^{-5}$ Torr. The simultaneous molybdenum deposition and argon bombardment were continued until a layer thickness of 800 Angstroms was obtained. The molybdenum and silicon films were patterned utilizing the previously described photoresist exposure and development procedure to yield a series of 22 parallel exposed lines 50 $\mu$m in width with a space between each line of 50 $\mu$m. The uncovered regions of molybdenum were then immersed for 20 seconds in an acid-based etchant. (This etchant is a proprietary product of Transene Company, Inc., Rowley, Mass.) The etch removed the uncovered regions of molybdenum but left a thin conducting interfacial layer that was resistant to the selective plasma etch used to remove the underlying silicon layer without damaging the tungsten electrodes.

The photoresist was removed as previously described. Through the previously described photoresist exposure and development procedure, a mask was formed having squares with approximately 50 $\mu$m dimension overlying each intersection of row with column electrodes. The exposed surface of the sample was then reactively ion etched, as previously described, in sulfur hexafluoride, utilizing a pressure of 20 milliTorr for 1 minute. This etching removed the conducting layer remaining from the previous etch and allowed continued etching of the silicon without damage to either the molybdenum or tungsten electrodes. This etch removed only a portion of the silicon film. The remaining silicon film was removed in an etch highly selective to silicon relative to tungsten. This etch was performed in the reactive ion etcher, as previously described, utilizing a ratio of 4:20 by flow rate of sulfur hexafluoride and hydrogen. A pressure of 20 milliTorr with a self-regulating voltage of 20 volts applied to a quartz cathode was utilized for 65 minutes. The photoresist was then stripped as previously described. The procedure, as viewed at one matrix intersection, left a silicon-containing region, 16, and a molybdenum column electrode, 20, with windows, 29.

The sample was illuminated by placing it under the objective lens of a standard optical microscope. Koheler illumination was employed utilizing a tungsten lamp having a power of approximately 10 watts. When a single intersection was illuminated, the resistance was approximately 30 megaohms. When the illumination was removed, the resistance was greater than 300 megaohms at a voltage of approximately 0.5 volts.

What is claimed is:

1. A structure suitable for information processing comprising a matrix and active electronic devices interacting with said matrix wherein said matrix comprises a plurality of row electrodes and a plurality of column electrodes, said matrix having intersecting regions that connect row electrodes to column electrodes wherein means are provided such that said information in process during said processing is interacting simultaneously with all said matrix intersections characterized in that
at least a portion of said intersecting regions comprise a photoconductive material.

2. The structure of claim 1 wherein said photoconductive material comprises silicon.

3. The structure of claim 2 wherein said photoconductive material comprises hydrogenated silicon.

4. The structure of claim 2 wherein at least a portion of said electrodes comprises tungsten.

5. The structure of claim 1 wherein at least a portion of said electrodes comprises tungsten.

6. The structure of claim 1 wherein the input to said matrix comprises a photoconductive material.

7. The structure of claim 1 wherein said means comprises an electrical connection introducing the output of said active elements back into said matrix.

8. A procedure for processing information comprising the steps of introducing said information into a structure comprising a matrix and active electronic devices interacting with said matrix wherein said matrix comprises a plurality of row electrodes and a plurality of column electrodes, said matrix having intersecting regions that connect row electrodes to column electrodes wherein said information in process during said processing interacts simultaneously with all said matrix intersections characterized in that
at least a portion of said intersecting regions comprise a photoconductive material and said processing is influenced by causing light to be incident on at least one of said photoconductive intersecting regions.

9. The structure of claim 8 wherein said photoconductive material comprises silicon.

10. The structure of claim 8 wherein said photoconductive material comprises hydrogenated silicon.

11. The structure of claim 10 wherein at least a portion of said electrodes comprises tungsten.

12. The structure of claim 8 wherein at least a portion of said electrodes comprises tungsten.

13. The structure of claim 8 wherein the input to said matrix comprises a photoconductive material.

14. The procedure of claim 8 wherein said simultaneous interaction is provided by feeding back the output of said active elements to said matrix.

* * * * *